United States Patent [19]

Tung et al.

[11] Patent Number: 5,185,277
[45] Date of Patent: Feb. 9, 1993

[54] METHOD FOR THE MAKING OF A TRANSISTOR GATE

[75] Inventors: Pham N. Tung, Paris; Martine Chapuis, Yerres, both of France

[73] Assignee: Thomson Composants Microondes, Puteaux, France

[21] Appl. No.: 714,230

[22] Filed: Jun. 12, 1991

[30] Foreign Application Priority Data

Jun. 12, 1990 [FR] France .................. 90 07280

[51] Int. Cl.$^5$ ........................... H01L 21/70
[52] U.S. Cl. .......................... 437/39; 437/40; 437/80; 437/175; 437/229; 437/912; 437/944; 148/DIG. 100
[58] Field of Search ............ 437/29, 39, 40, 41, 437/80, 912, 944, 175, 176, 229; 148/DIG. 100

[56] References Cited

U.S. PATENT DOCUMENTS

| | | |
|---|---|---|
| 4,283,483 | 8/1981 | Coane . |
| 4,334,349 | 6/1982 | Aoyama et al. ............ 437/944 |
| 4,337,115 | 6/1982 | Ikeda et al. ............... 437/944 |
| 5,006,478 | 4/1991 | Kobayashi et al. ......... 437/944 |

FOREIGN PATENT DOCUMENTS

| | | |
|---|---|---|
| 0410385 | 1/1991 | European Pat. Off. . |
| 0047372 | 4/1977 | Japan . |
| 0071978 | 6/1977 | Japan . |
| 0055015 | 3/1984 | Japan . |
| 0154539 | 8/1985 | Japan . |

OTHER PUBLICATIONS

IEEE Transactions on Electronic Devices, vol. ED-32, No. 6, Jun. 1985, pp. 1042-1046, IEEE, U.S., P. C. Chao et al.: "Electron-Beam Fabrication of GaAs Low-Noise MESFET's Using a New Trilayer Resist Technique".

IEEE Electron Device Letters, vol. EDL-4, No. 2, Feb. 1983, pp. 42-44, IEEE, U.S., S. G. Bandy et al.: "Submicron GaAs Microwave FET's with Low Parasitic Gate and Source Resistances".

*Primary Examiner*—Tom Thomas
*Attorney, Agent, or Firm*—Oblon, Spivak, McClelland, Maier & Neustadt

[57] ABSTRACT

Disclosed is a method for making a mushroom gate for a microwave transistor. Three masking layers are deposited on the semiconductor body of a transistor. At least two of these masking layers are different and have selective solvents. After the opening of the external layer, the intermediate layer is dissolved with sub-etching with respect to the external layer, then the base of the gate is etched in the internal layer. The edges of the sub-etching prevent the metal deposited on the mask from adhering to the gate, thus facilitating the lift-off of the mask. Application to microwave transistors with symmetrical or disymmetrical mushroom gate.

3 Claims, 1 Drawing Sheet

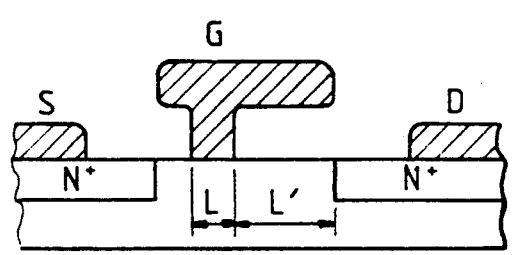
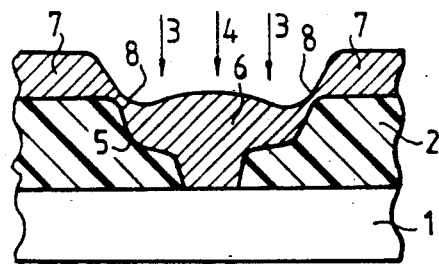
FIG.1 PRIOR ART    FIG.2
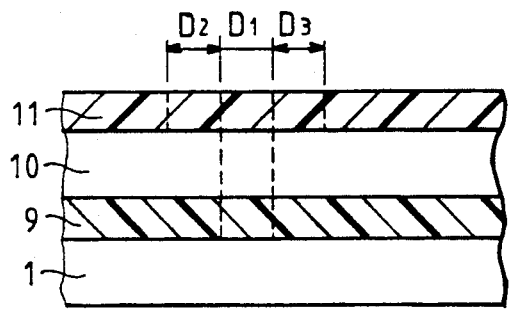
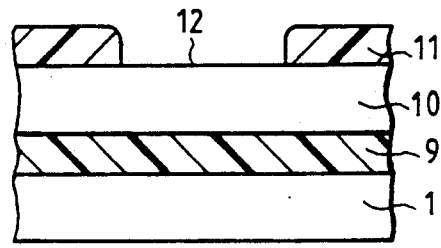
FIG.3    FIG.4
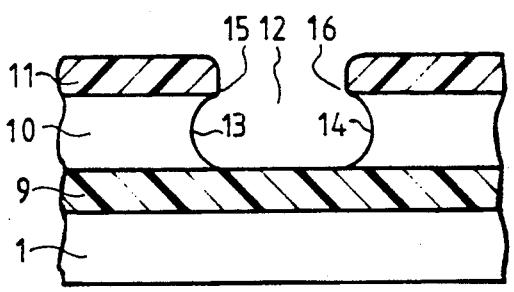
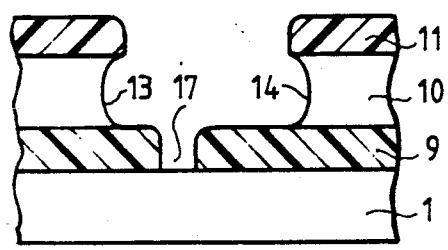
FIG.5    FIG.6
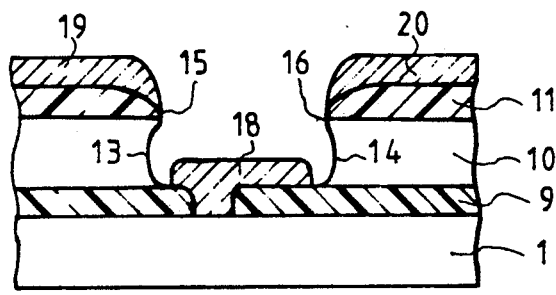
FIG.7

METHOD FOR THE MAKING OF A TRANSISTOR GATE

BACKGROUND OF THE INVENTION

1. Field of the Invention

The present invention relates to a method for the manufacture of the gates of field-effect transistors, more particularly dedicated to microwave transistors, for which the gate has to be thin at its base and, at the same time, has an apron or cap that reduces its electrical resistance: these gates are called mushroom gates.

The performance characteristics of a field-effect microwave transistor, as shown schematically in FIG. 1, depend partly on the length L of the gate G, measured along the source S/drain D axis L must be reduced when the frequency is increased. At the same time, they depend on the electrical resistance of the gate which is higher for thinner gates. There is a constant search, in the designing of transistors, for low values of access resistance.

2. Description of the Prior Art

It is for these reasons that mushroom-shaped gate metallizations have been developed. These gates have a base with a small width (in the micronic or sub-micronic range) and an apron or cap that is wider and is given an additional coat of metal to reduce the electrical resistance.

However, the performance characteristics of a microwave transistor in general, and those of a power microwave transistor in particular, are improved by increasing the distance between the gate G and the doped zone n⁻ controlled by the drain D: this reduces the gate/drain stray capacitance $C_{GD}$ and increases the breakdown voltage of the transistor.

A disymmetrical structure such as this is shown in FIG. 1. Depending on whether the transistor has a recess for the gate or is self-aligned, this positional disymmetry of the gate may be obtained by different expedients, among them the deposition of the gate at a slight inclination, or else an additional masking to take the disymmetrical n⁻type implanted zone to a distance from the two source and drain trenches.

However, depending on whether the mushroom gate is disymmetrical or not, its manufacture remains a delicate operation for the following reason, shown schematically in FIG. 2: the most common method consists in the deposition of a thick layer 2 of masking resin on a wafer 1 made of semiconductor materials (comprising the substrate and the different layers constituting a transistor). With an appropriate beam of electrons or X-rays, a first scan 3 is made to define the apron of the gate on a part of the thickness of the resin 2, then a higher energy second scan 4 is made to define the base of the gate throughout the thickness of the resin 2. The different doses may be obtained either by modifying the energy of the beam or by carrying out several passes for the second scan 4. After the irradiated resin has been dissolved, there remains an indentation in which there is deposited the metal of the mushroom gate 6, thickened by electrolytic means. The metal is also deposited at 7 on the upper face of the resin layer 2, and forms fine membranes at 8, adjoining the metallizations 6 and 7.

The drawback of this method arises out of the fact that, when the resin 2 is dissolved during a lift-off operation, the metal film 7 remains soldered to the gate 6 by the membranes 8 because the implantation and the dissolving of a single masking resin cannot give an indentation contour 5 such that there is a sharp break in the contour between the upper face of the resin 2 and the lateral walls of the indentation 5. The rounded portions caused by the lift-off operation means that, at 8, the metal of the film 7 descends into the indentation 5, and is continous with the gate 6.

SUMMARY OF THE INVENTION

The method according to the invention gets rid of this drawback. To make a mushroom gate, it provides for the use of three superimposed masking layers, chosen from among at least two organic and/or mineral products that enjoy high dissolving selectivity. To each product, there corresponds at least one solvent that does not etch the other product and vice versa. This makes it possible to carry out a selective etching for each masking layer and, in particular, to carry out a sub-etching of the central layer, so that the upper layer becomes a projecting feature. The presence of this projecting feature breaks the continuity between the metal deposited in the indentation to form the gate and the metal deposited on the external face of the upper layer.

More precisely, the invention relates to a method for making a transistor gate, said gate having a mushroom shape and including a narrow base and an apron that is wider than the base; a method wherein three masking layers are used, the nature of the intermediate layer being different from tha of the first and third layers, said intermediate layer being furthermore soluble in a selective solvent that is not a solvent of the first and third layers, so that this intermediate layer may be sub-etched with respect to the third layer, which is external with respect to the body of the transistor.

BRIEF DESCRIPTION OF THE DRAWINGS

The invention will be understood more clearly from the detailed explanation of an exemplary embodiment, made with reference to the appended FIGURES, of which:

FIG. 1 shows a sectional view of a prior art transistor, described here above;

FIG. 2 is a drawing showing the manufacture of a mushroom gate according to the prior art, described here above.

FIGS. 3 to 7 show steps in the manufacture of a mushroom gate according to the invention.

DETAILED DESCRIPTION OF THE INVENTION

The first step of the method, illustrated in FIG. 3, assumes that the body 1 of the transistor is already formed: it includes a substrate, the smoothing layers, the active layers with or without heterojunctions, it is possible that the trenches are possible the trenches doped with contacts for electrodes. The upper face of the body 1 is shown herein as being plane but it may have a recessed groove in the region of the future gate.

Three masking layers 9, 10, 11 are deposited on body 1. The first layer 9, which is in contact with the semiconductor body 1, is constituted, for example, by a first masking resin. This masking resin is preferably electrosensitive for, if the base of the gate has to be submicronic, irradiation by electrons or X-rays is more precise than photon exposure. This resin is, for example, a polymethyl methacrylate and it is deposited in a thickness of the order of 3000 angstroms.

The second, intermediate layer 10 is formed either by a second masking resin, the nature of which is different from that of the first resin, or by a mineral product such as silica for example: the important point is that the intermediate layer 10 is soluble selectively in relation to the other two layers. If it is a masking resin, it may be a polymethyl glutamate or poly(dimethyl glutarimide) with a thickness of the order of 7000 angstroms.

The third layer 11, on the surface, may have the same nature as the first layer 9. It has a thickness that is also of the order of 3000 angstroms.

At the location of the future gate, the three layers are then subjected to a selective electron masking. The base of the gate, with a length D1, which will be in the thickness of the first layer 9, is subjected to an electron bombardment of sufficiently high energy so that electrons reach the surface of the semiconductor body 1: for example five scans with a width D1. The apron, or mushroom, of the gate will be in the thickness of the second layer 10 and will have a length D1+D2+D3 equal to that of the base plus the lengths, whether symmetrical or not, of the two caps. To define this apron, the third layer 11 is subjected to an electron masking with a far smaller dose, just enough to sensitize the surface layer 11, which will furthermore entail a far longer development time: for example, only one scan with a length D1+D2+D3 is done.

The order of the two maskings can be reversed without any inconvenience for the method.

The intermediate layer 10 is therefore not subjected to an electron bombardment except in that part of its length D1 corresponding to the base of the gate, and slightly at its interface with the third layer 11. It will be subsequently etched by selective dissolving through the aperture of the third layer 11. The following operations concern the selective development of the three masking layers.

The surface layer 11 is first of all developed by a solvent that does not dissolve the intermediate layer 10: an aperture 12, shown in FIG. 4, is obtained. If the surface layer 11 is made of polymethyl methacrylate, its selective solvent is a mixture of propanol and methyl ethyl ketone in a concentration of 35% by volume, and the development lasts two minutes, at a temperature of 22° C.

Through the aperture 12, the intermediate layer 10 is etched by a solvent that dissolves neither the surface layer 11 nor the buried layer 9. If the layer 10 is made of polymethyl glutamate, this selective solvent is a basic aqueous solution, of soda for example. The development of the layer 10 lasts about two minutes.

The value of these operations of selective development is that, as can be seen in FIG. 5, they make it possible to prolong the dissolving of the intermediate layer for a time that is sufficient to obtain a sub-etching, at 13 and 14, beneath the third layer 11. Thus, the edges of the aperture 12 form projecting features at 15 and 16 that break the continuity of the lateral faces of the indentation etched in the masking layers, and these projecting features 15 and 16 will subsequently prevent the formation of a continuous metal film, as shown at 8 in FIG. 2.

Finally, in FIG. 6, the base of the gate is etched at 17 by the development, for 30 seconds, of the irradiated part, having a length D1, in the first layer 9. It is advantageous for the first and third layers 9 and 11 to be made of the same resin and to have the same active solvent that does not dissolve the second layer 10. Should a third resin, different from the other ones, be used to define the base of the gate, because it permits a finer etching, then it is necessary to choose a third selective solvent that dissolves neither the second nor the third layers 10 and 11.

This is why it is worthwhile to use silica to form the second layer 10. There is then:
- a first layer 9, which is an organic layer, dissolved by a first organic solvent or a mineral solution;
- a second layer 10, which is a mineral layer, dissolved by a mineral solution;
- a third layer 11, which is an organic layer, but may be different from the first layer 9 and dissolved by a second organic solvent, or a basic aqueous solution.

This makes it possible to play on the etching precision of the layers and on their sensitivity to electron masking, while at the same time retaining the possibility of sub-etching the intermediate layer.

The gate metallization operation, shown in FIG. 7, is a standard one for this type of method. The metal or alloy of metals, used to make an ohmic or Schottky contact gate, is evaporated by a directional method. It is deposited at the bottom of the indentation to make a gate 18, but also at 19 and 20 on the third masking layer. However, the projecting features 15 and 16 are used both to self-align the gate 18 and to separate the metal film, which is at the third layer, from the gate 18.

This facilitates the final lift-off which eliminates the metal film 19-20 and the masking layers 9, 10, 11. The gate 18, the base of which is very thin for the microwave applications, may be given an additional coat of metal by electrolysis to reduce its electrical resistance.

The two caps of the gate will be used, as the case may be, to self-align the $n^+$ regions and source and drain metallizations of a transistor which is either a low-noise transistor or a power transistor.

What is claimed is:

1. A method for making a mushroom gate having a base and an apron which is wider than the base, comprising the steps of:
    depositing first, and second layers on a substrate, said first and second layers comprising first and second materials, respectively, which are dissolvable by first and second solvents, respectively, wherein the first solvent is not a solvent of the second layer and the second solvent is not a solvent of the first layer;
    depositing a third layer above the second layer, wherein said third layer is dissolvable by a third solvent which is not a solvent of said second layer;
    irradiating an area of the third layer which is equal to an area of said apron, with an electron irradiation, wherein the radiation is limited to act essentially only upon the third layer;
    irradiating an area of the first layer, which is equal to an area of the base, with electron irradiation; then
    dissolving the irradiated portion of the third layer with said third solvent, thereby opening a window in the third layer;
    dissolving a portion of said second layer with said second solvent, thereby undercutting the window formed by the third layer;
    dissolving the irradiated area of the first layer with the first solvent.

2. A method according to claim 1, further comprising the step of:
    depositing a metallization through the window in order to form the gate electrode.

3. A method according to claim 2, further comprising the step of:
    dissolving the three layers, thereby removing metal deposited on the third layer.

* * * * *